(12) United States Patent  
Hoffmeyer et al.

(10) Patent No.: US 12,016,127 B2
(45) Date of Patent: Jun. 18, 2024

(54) LIQUID METAL INFILTRATION REWORK OF ELECTRONIC ASSEMBLY

(71) Applicant: International Business Machines Corporation, Armonk, NY (US)

(72) Inventors: Mark K. Hoffmeyer, Rochester, MN (US); Timothy P. Younger, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/354,957

(22) Filed: Jul. 19, 2023

(65) Prior Publication Data

US 2023/0371221 A1    Nov. 16, 2023

Related U.S. Application Data

(62) Division of application No. 17/657,775, filed on Apr. 4, 2022, now Pat. No. 11,751,369, which is a division of application No. 16/659,750, filed on Oct. 22, 2019, now Pat. No. 11,310,950.

(51) Int. Cl.  
*B23K 1/00* (2006.01)  
*B23K 1/018* (2006.01)  
*H05K 13/04* (2006.01)

(52) U.S. Cl.  
CPC ......... *H05K 13/0486* (2013.01); *B23K 1/018* (2013.01); *H05K 2203/043* (2013.01)

(58) Field of Classification Search  
CPC .. B23K 1/018; B23K 1/0016; B23K 2101/42; B23K 35/025; B23K 35/26; B23K 3/082  
See application file for complete search history.

(56) References Cited

U.S. PATENT DOCUMENTS

| 3,171,734 | A | * | 3/1965 | Berson ................ B23K 35/304 228/262.9 |
| 3,289,399 | A | | 12/1966 | Princiotta, Jr. |
| 3,644,980 | A | | 2/1972 | Class, Jr. et al. |
| 4,366,925 | A | | 1/1983 | Fanene |
| 4,412,641 | A | | 11/1983 | Fuchs et al. |
| 4,444,559 | A | | 4/1984 | Schink et al. |
| 4,569,473 | A | | 2/1986 | Guiliano |
| 4,767,047 | A | | 8/1988 | Todd et al. |
| 4,782,991 | A | | 11/1988 | Breu |
| 4,817,851 | A | | 4/1989 | Kolesar et al. |

(Continued)

FOREIGN PATENT DOCUMENTS

JP    2018516755 A    6/2018

OTHER PUBLICATIONS

Hosoda et al., "Smart disassembly (joint separation method)", Proc. IEEE International Symposium on Electronics and the Environment 2004, pp. 166-167 (2004).

(Continued)

*Primary Examiner* — Erin B Saad  
(74) *Attorney, Agent, or Firm* — Robert J. Shatto

(57) ABSTRACT

Provided is a method for removing an electronic component from a printed wiring board. The method comprises applying an embrittlement agent to a lead of an electronic component that is soldered to the printed wiring board. The electronic component is removed from the printed wiring board by breaking the embrittled lead.

20 Claims, 11 Drawing Sheets

(56) References Cited

U.S. PATENT DOCUMENTS

| | | | |
|---|---|---|---|
| 4,934,582 A * | 6/1990 | Bertram | H05K 13/0486 228/19 |
| 5,072,874 A * | 12/1991 | Bertram | H01L 24/799 228/19 |
| 5,130,689 A * | 7/1992 | Raykhtsaum | H01H 37/761 337/296 |
| 5,139,883 A * | 8/1992 | Raykhtsaum | H01L 24/85 428/673 |
| 5,427,865 A | 6/1995 | Mullen, III et al. | |
| 5,439,637 A | 8/1995 | Moyer | |
| 5,629,239 A * | 5/1997 | DiStefano | H01L 23/49861 29/827 |
| 5,871,139 A * | 2/1999 | Moyer | B23K 35/00 228/264 |
| 6,184,475 B1 | 2/2001 | Kitajima et al. | |
| 6,295,709 B1 * | 10/2001 | Klein | H05K 3/3452 228/179.1 |
| 6,574,859 B2 | 6/2003 | Farooq et al. | |
| 8,167,189 B2 * | 5/2012 | Zinn | B23K 3/029 228/264 |
| 9,445,503 B2 * | 9/2016 | Bergenek | H01L 33/62 |
| 9,682,533 B1 * | 6/2017 | Gross | B32B 15/043 |
| 9,801,285 B2 | 10/2017 | Koep et al. | |
| 10,559,549 B2 * | 2/2020 | Danovitch | B23K 3/082 |
| 11,278,977 B2 | 3/2022 | Hoffmeyer et al. | |
| 11,310,950 B2 | 4/2022 | Hoffmeyer et al. | |
| 2006/0054657 A1 * | 3/2006 | Francis | H05K 13/0486 228/19 |
| 2011/0024484 A1 | 2/2011 | Suihkonen et al. | |
| 2011/0240716 A1 * | 10/2011 | Zinn | B23K 1/018 228/264 |
| 2012/0299202 A1 * | 11/2012 | Yamaguchi | H01L 24/92 438/118 |
| 2013/0140069 A1 * | 6/2013 | Kitajima | H05K 3/3485 252/514 |
| 2018/0233482 A1 | 8/2018 | Danovitch et al. | |
| 2018/0233483 A1 * | 8/2018 | Danovitch | H01L 24/799 |
| 2021/0114126 A1 * | 4/2021 | Hoffmeyer | H05K 3/3436 |
| 2021/0120713 A1 * | 4/2021 | Hoffmeyer | B23K 1/018 |
| 2022/0232746 A1 | 7/2022 | Hoffmeyer et al. | |

OTHER PUBLICATIONS

List of IBM Patents or Patent Applications Treated as Related, Jul. 18, 2023, 2 pgs.

Nguena et al., "Ga Liquid Metal Embrittlement for Fine Pitch Interconnect Rework", 67th IEEE Electronic Components and Technology Conference (ECTC), pp. 1584-1591 (2017).

Perepezko et al., "Analysis of Melt Undercooling and Crystallization Kinetics," https://link.springer.com/article/10.1007/s11661-015-2970-9, first online May 30, 2015, printed May 29, 2019, 6 pgs.

\* cited by examiner

LIQUID METAL INFILTRATION REWORK OF ELECTRONIC ASSEMBLY

BACKGROUND

The present disclosure relates generally to the field of electronic printed wiring board (PWB) assembly rework, and more particularly to removing an electronic component from the PWB during a rework operation using liquid metal infiltration.

Rework is the refinishing operation or repair of an electronic PWB assembly, usually involving desoldering and re-soldering of surface-mounted electronic components. A hot air gun or hot air station is used to heat devices and melt solder, and specialized tools are used to pick up and position the often tiny components. Ball grid arrays (BGA) present special difficulties for rework, as they have many small, closely spaced pads on their underside which are connected to matching pads on the PWB. Connecting pins are not accessible from the top and cannot be desoldered without heating the whole device to the melting point of the solder.

SUMMARY

Embodiments of the present disclosure include a method, computer program product, and system for removing an electronic component from a printed wiring board. The method comprises applying an embrittlement agent to a lead of an electronic component that is soldered to the printed wiring board. The electronic component is removed from the printed wiring board by breaking the embrittled lead.

Further embodiments of the present disclosure include a composition of matter. The composition of matter comprises a carrier medium and a plurality of metal particles in the carrier medium. The plurality of metal particles include one or more metals that cause liquid metal embrittlement of a solder material. The carrier medium is at least one of a flux carrier or a solvent carrier.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
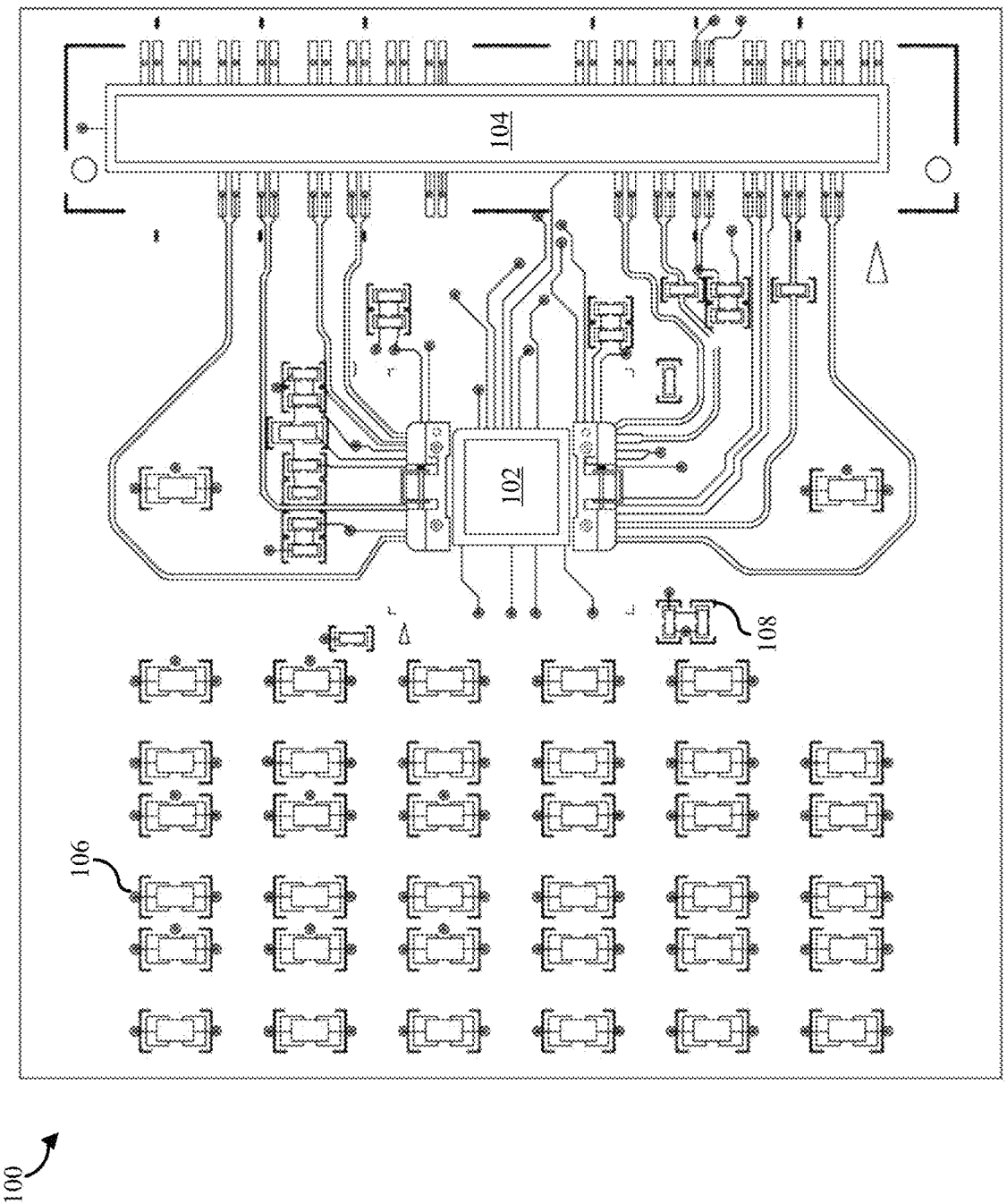
FIG. 1 illustrates an example printed wiring board (PWB) containing numerous components which may be removed using a liquid metal infiltration rework process, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of electronic printed wiring board (PWB) assembly rework, and in particular to removing an electronic component from the PWB during a rework operation using liquid metal infiltration. While the present disclosure is not necessarily limited to such applications, various aspects of the disclosure may be appreciated through a discussion of various examples using this context.

Printed wiring board (PWB) motherboards, backplanes, and other peripheral boards incorporated within the hardware architecture of high performance computers commonly use multiple connection types for mounting electronic components to the PWB. Electronic components can be mounted on the PWB using a variety of surface-mount technologies (SMT). Such components are referred to a surface-mount components (SMCs), and can broadly be classified into two groups: those that connect to the PWB using exposed leads and those that connect using hidden connectors. For example, some electronic components may be soldered to the PWB using a set of exposed leads (e.g., gull-wing leads, j-leads, flat leads) around the edge(s) of the electronic component.

Meanwhile, other electronic components may be mounted to the PWB using hidden connection joints (e.g., soldered along the bottom of the component). For example, many PWBs include hybrid land grid array sockets (HLGA sockets) for separable mounting of land grid array (LGA) CPU modules, as well as other LGA form-factor modules and board-to-board, ball grid array (BGA) connector assemblies. Examples of electronic components that may have an LGA form-factor include graphics processing units (GPUs), field-programmable gate arrays (FPGAs), logic control modules, switches, and/or BGA connectors used for mezzanine-style interconnection of boards.

HLGA and BGA-type connectors can support large modules requiring thousands of interconnection points, where continued increases in size scaling is required to support ever increasing performance and computing bandwidth needs. For example, HLGA sockets used to provide separable mounting of CPU modules in IBM® systems have grown from supporting 50×50 mm modules having approximately 2500 total I/O connections, to modules that are over 68×68 mm in size having almost 3900 total I/O connections. Furthermore, future systems include HLGA sockets requirements that must support CPU modules of larger size and total connection counts in excess of 5000 I/O.

Many complex printed wiring board assemblies (PWBAs) have a variety of temperature sensitive components (TSCs), and other components such as large BGA components, solder attached to board surfaces. This further complicates typical hot air/inert gas solder assembly rework operations. In many circumstances, rework complications involve the application of significant board preheat and hot gas heat delivery, which can drive excess temperatures locally and globally to the circuit board. Extreme care with temperature profiling individual components must be taken to avoid the need for removing other BGA components from board surfaces to prevent module reliability problems affiliated with partial reflow of array components during said rework operations. In other words, care must be taken to ensure that the removal process for one component does not damage a second component, thereby requiring rework of the second component.

Cascading rework scenarios described above are common on complex PWBAs and can tax PWB reliability limits as excess reflow cycles drive strain on plated vias and can undermine reliability by causing formation of via microcracks and potential for latent field failures. In addition, partial reflow of solder joints on adjacent components using standard rework operations may also impact reliability as a result of hot tear joints that can develop during rework operations.

In addition, as socket sizes grow, rework challenges continue to mount when using conventional local hot air/inert gas reflow operations, where use of conventional operations may not be practical at all for socket form factors that are in excess of 70×70 mm in size. Providing uniform hot gas flow onto and around large array connectors that is sufficient to melt all solder ball attachments to enable device removal without damage to the PWB requires very precise time and temperature control and a small process window with restrictions on the number of allowable site reworks and/or adjacent reworks, in addition to requiring removal of other TSCs present on the PWBs so as to avoid damaging the TSCs. As a result, the process is expensive, difficult, restrictive, and very time consuming with potential for high yield loss and post rework reliability issues, especially on thick cross section PWBs.

To address these issues, embodiments of the present disclosure include rework processes for removing electronic components from PWBs using embrittlement agents. As discussed herein, the embrittlement agents may include one or more metals (e.g., one or more types of metal particles) that cause liquid metal embrittlement. The embrittlement agent may be embodied in a low melt solder paste, a solder alloy emulsion, or preformed sheets. When applied to the leads or solder joints of the electronic components, the embrittlement agents may infiltrate the leads/joints and cause a reduction in tensile ductility of the component and/or causing the leads/joints to undergo brittle fracture. The reduced ductility of the component allows the component to be removed from the board using physical/mechanical force without damaging the PWB and/or neighboring components.

Embodiments of the present disclosure include a method, computer program product, and system for removing an electronic component from a printed wiring board. The method comprises applying an embrittlement agent to a lead of an electronic component that is soldered to the printed wiring board. The electronic component is removed from the printed wiring board by breaking the embrittled lead.

Additional embodiments of the present disclosure include a method, computer program product, and system for removing an electronic socket from a printed wiring board. The method comprises placing an embrittlement sheet over an electronic socket on a printed wiring board. The electronic socket is mounted to the printed wiring board using a plurality of hidden solder joints. The method further comprises causing the embrittlement sheet to melt. The melted embrittlement sheet wets the plurality of hidden solder joints. The electronic socket is removed from the printed wiring board by breaking the embrittled solder joints.

Further embodiments of the present disclosure include a composition of matter. The composition of matter comprises a carrier medium and a plurality of metal particles in the carrier medium. The plurality of metal particles include one or more metals that cause liquid metal embrittlement of a solder material. The carrier medium is at least one of a flux carrier or a solvent carrier. The composition of matter may be in the form of, for example, a paste, emulsion, and/or preformed planar sheet.

Embrittlement Paste and/or Emulsion

Some embodiments include a rework process involving selective application of low melt solder paste or solder alloy emulsion to lead surfaces of the components requiring removal. The low melt solder pastes or emulsions consist of a mixture of flux carrier and/or solvent carrier with preservatives and metal particles. The particles are high purity metals such as Gallium, mixtures of high purity metal particles such as Ga—Sn, Ga—In, Ga—Sn—In, or pre-alloyed particles having similar metallic content. The mixtures of these pure metal or alloyed particles may also contain other alloying additions including Cu, Ag, and Sb to control range of melting and to alter wetting properties.

These high purity metal particle mixtures or alloy particle mixtures are tailored to a range of compositions that enable melting at T's of 120° C. or less depending on application needs. In some embodiments, the pure metal mixtures and alloy compositions can readily melt at or below room temperature, and the embrittlement agent utilizing these compositions may require refrigeration. After paste dispense application onto component leads, the assembly may be heated to a desired temperature (if needed to melt the embrittlement paste). This heating causes the embrittlement paste to melt, and when held at a desired temperature and time above its melting range (but well below the melting temperature of the solder joints undergoing rework), its liquid diffuses into grain boundaries of the solid solder connections of the component, forming a web of liquid within the joints.

Once this interconnected web of liquid forms, the joints become slushy and parts can be removed from PWB surfaces without impacting reliability of adjacent components. In some embodiments, this operation is a dynamic and transient alloying process, and the amount of time that the embrittlement paste is allowed to infiltrate, and temperature that the embrittlement paste is heated to, may be determined or optimized based on the composition of the embrittlement paste, the solder material, and/or the thickness of the solder joint and/or lead. After component removal, the rework operation is completed using operations commonly used in the industry including site redress using a vacuum solder tool to remove residual alloyed solder from pads, followed by deposition of fresh solder paste of an alloy composition intended for attachment, the placement of new devices, and subsequent device attachment using standard manual or semiautomated reflow soldering equipment.

An advantage of using Ga or Ga alloy compositions consisting of either or both Sn and In additions is that ingots of material of the selected composition can be readily made on the site of use and made into liquid metal droplet/particle form by using a droplet emulsion technique (DET). The DET is essentially a high speed blending method used on a bulk metal ingot placed in a tube with a carrier fluid and surface reactant chemicals with inert cover gas. When the sample is heated sufficiently to melt the ingot, the DET is used to turn the bulk liquid metal into a dispersion of fine liquid droplets that remain stable in liquid state within the carrier fluid and additives. Processing using this technique minimizes droplet oxidation and also inhibits liquid droplet agglomerations. In some embodiments, metals and alloys that are liquid at, near, or below room temperature can use an alcohol carrier for emulsion creation. The resulting emulsion can be dispensed to the component sites (e.g., the leads) to cause embrittlement of the component sites. Because the emulsion carrier is alcohol, the emulsion carrier is simply allowed to evaporate once applied to the leads being reworked, thus minimizing the presence of residues that can complicate post component removal site cleanup and redress operations.

Furthermore, because the DET allows for deep undercooling of metals and alloys well below their melting point, emulsions can be applied while particles are in liquid state even though the application temperature may be above the equilibrium temperature normally required to initiate solidification. This may enable a rapid wetting reaction with the component solder joint under rework.

Embodiments of the present disclosure that utilize an embrittlement paste or emulsion are shown and described in reference to FIGS. 2 and 3A-3E.

Embrittlement Sheets

In some embodiments, a low-temperature rework process using custom preformed sheets or preformed layers is used to remove electronic components from a PWB. The preformed sheets may be comprised of Ga, or alloys of Ga—In, Ga—Sn or Ga—In—Sn. The sheet or preform layer of one (or more) of these materials is first made via casting, stamping, rolling, or any other suitable method to a prescribed thickness. The thickness may depend on the metal or alloy selected. In some embodiments, when alloy sheets are processed, the sheet forming operation may need to be performed under refrigeration with post forming refrigeration required as well since many alloys made from these elements are liquid at room temperature or below. A sheet of specified thickness and X-Y dimensions is then placed onto the HLGA socket site surface on the PWB such that it resides within the socket alignment cavity and is in direct contact with the Au plated spring contacts of the connector. In some instances, depending on the alloy selected and its wetting and oxidation properties, a pre-fluxing of the array site surface may be applied prior to application of the preform sheet.

After placement, the preform sheet is melted with application of mild local heat, as necessary. The local heat may be applied to the bottom of the PWB, opposite the embrittlement sheet, to encourage the melted embrittlement agents to melt through the socket. In some embodiments, heating may be applied to both sides of the PWB to increase the melting rate. Even when both sides of the PWB are heated, the bottom of the PWB may be heated to a higher temperature than the top of the PWB in some embodiments. In some embodiments, a mechanical force may be applied to the top of the preform sheet (e.g., using a Teflon sheet) to assist in forcing the embrittlement agents through the socket and onto the underlying contacts.

The molten sheet then wets to the individual contacts, and the liquid metal is then drawn onto the contact surfaces by reactive wetting forces. Because HLGA connectors are comprised of individual spring contacts that are inserted into individual holes present in socket housings, the liquid metal rework material wets along the contact surfaces through these holes and has access to the solder ball joints that provide interconnections on the PWB surface. As wetting proceeds in a controlled fashion through the contact housing apertures, it makes a precise, local contact with contact paddle/solder ball connection interfaces and the solder balls that provide connections to the PWB surface.

Once the liquid metal rework material reaches the contact/solder ball interconnection surfaces, it wets on them and infiltrates solder connection grain boundaries forming a liquid film network. A mild backside heating of the card assembly, if provided, can accelerate the overall wetting process to the solder ball/contact interconnection interfaces. Once the liquid film network forms, the socket component can be easily removed from the PWB by separating it from the weakened solder ball solder joint interfaces.

The balance of excess liquid rework metal will remain generally contained within the top surface of the connector socket housing for recovery while the liquid metal wetting the contacts can be generally localized to the individual contacts by controlling time and temperature used for the overall rework operation. As such, embodiments can provide for a directed and well controlled application of rework material that provides simple containment to minimize cross contamination, minimizes waste to reduce cost and improve material recovery for reuse, while allowing for low temperature removal of large components on high mass PWBs critically needed for future CPU applications. Because embodiments can be performed at low temperature, occurrence of cascading rework scenarios complicated by partial reflow of adjacent components and/or presence of TSCs may be greatly reduced, thereby improving overall board reliability and reducing overall rework complexity.

Once the components are removed, the excess solder and/or solder balls present on the array sites are then removed, and the site is redressed using conventional fluxing, coupled with a hot solder blade, and vacuum solder clean up tool. These operations are typically used for conventional hot air reflow post component removal rework and site redress operations. After this site redress operation is complete, solder paste for new component attachment is added to the array site per usual means of stenciling or screen printing, followed by new socket placement and local solder reflow to the board surface.

Embodiments of the present disclosure that utilize an embrittlement sheet are shown and described in reference to FIGS. 4-7D.

It is to be understood that the aforementioned advantages are example advantages and should not be construed as limiting. Embodiments of the present disclosure can contain all, some, or none of the aforementioned advantages while remaining within the spirit and scope of the present disclosure.

Turning now to the figures, FIG. 1 illustrates an example printed wiring board (PWB) 100 containing numerous components 102-108 which may be removed using a liquid metal infiltration rework process, in accordance with embodiments of the present disclosure. The PWB 100 includes an HLGA socket 102, a connector jack 104 with external, gull-wing leads, a plurality of resistors 106, and a plurality of capacitors 108.

In the following figures, the removal of a component with gull-wing leads and of an HLGA socket are illustrated for exemplary purposes. As would be understood by one of ordinary skill in the art, the PWB 100 may include other electronic components (e.g., integrated circuits, diodes, inductors, switches, etc.), which may be removed using the rework techniques described herein. The examples shown in FIGS. 1-8 are provided for illustrative purposes only, and the disclosure is not to be limited to these specific examples.

Figure 2:
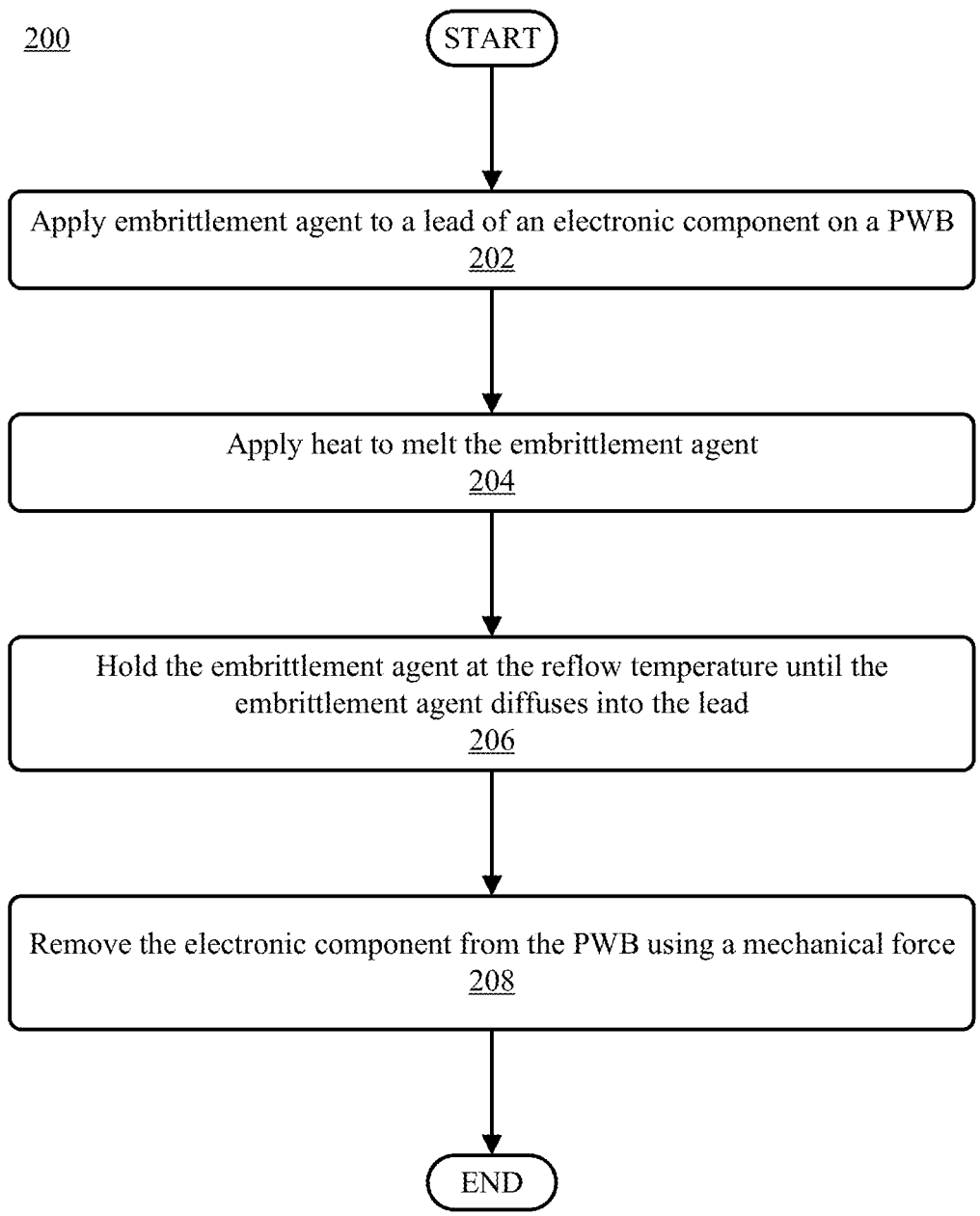
FIG. 2 illustrates a flowchart of an example method for removing an electronic component from a PWB using an embrittlement paste, in accordance with embodiments of the present disclosure.

Referring now to FIG. 2, illustrated is a flowchart of an example method 200 for removing an electronic component from a PWB using an embrittlement paste, in accordance with embodiments of the present disclosure. In some embodiments, the method 200 may be part of an automated (or semi-automated) rework process. For example, one or more operations of the method 200 may be performed by hardware, firmware, software executing on a processor, or any combination thereof. The method 200 may begin at operation 202, wherein an embrittlement agent is applied to a lead of an electronic component on a PWB.

As discussed herein, the embrittlement agent can be in one of several different forms. For example, the embrittlement agent may be a paste or emulsion. The embrittlement agent includes metal (or metal-alloy) particles dispersed in a carrier. The metal particles are selected such that they cause liquid metal embrittlement when applied to the lead of the electronic component. Example metal particles include, without limitation, elemental Ga, Ga—Sn alloys, Ga—In alloys, and Ga—Sn—In alloys. Additionally, the embrittlement agent may include Cu, Ag, and/or Sb, or alloys containing Cu, Ag, and/or Sb, to control melting temperature and wetting properties.

In some embodiments, the embrittlement agent includes a flux and/or a carrier. For example, if an embrittlement paste is used, a flux may be included to help avoid oxidation and to remove metal oxides that already exist. The flux may also improve the wetting characteristics of the embrittlement paste. Any suitable flux may be used including, without limitation, rosin fluxes, resin fluxes, organic fluxes, and inorganic fluxes.

In embodiments where the embrittlement agent is an emulsion, any suitable carrier medium may be used. For example, the embrittlement emulsion may include liquid metal particles (e.g., Ga particles) suspended in an alcohol carrier. This may be particularly advantageous in that alcohol is a relatively inert carrier, which will not damage the PWB and can be allowed to evaporate off (e.g., bake off) after the component is removed. The embrittlement emulsion may be made (e.g., on-site) by placing a metal ingot (e.g., a pure Ga ingot) in a suitable carrier (e.g., alcohol). The ingot is then heated up to its melting temperature, and spun in a "blender." This causes the liquid metal to separate and become suspended in the carrier in the liquid state. The resulting emulsion will stay in the liquid state below the normal freezing point of the metal.

The embrittlement agent may be applied to any part of the lead at operation 202. For example, the embrittlement agent may be applied to the "foot" of a gull-wing lead. Alternatively, or additionally, the embrittlement agent may be applied to the solder joint between the lead and the contact pad. The embrittlement agent may be applied by hand, or it may be applied by a computer-controlled apparatus/tool.

After applying the embrittlement agent to the lead at operation 202, the embrittlement agent may be heated, as necessary, at operation 204. Heating the embrittlement agent may decrease the viscosity of the embrittlement agent and allow the embrittlement agent to flow. The embrittlement agent may be heated to its reflow temperature, which is the temperature at which the embrittlement agent may flow around the lead and begin wetting the lead. The reflow temperature is also sufficiently high enough to allow the embrittlement agent to diffuse/infiltrate into the lead. In some embodiments, the embrittlement agent is heated to a temperature that meets or exceeds its reflow temperature.

The temperature that the embrittlement agent is heated to may depend on the composition of the embrittlement agent. For example, in some embodiments, the embrittlement agent is a liquid at room temperature (e.g., in the case of certain emulsions). In these embodiments, the embrittlement agent may be kept refrigerated when not used, and not external heat may be required/applied after depositing the embrittlement agent on the lead. In other embodiments, the embrittlement agent may be heated up to a temperature of approximately 120° C. In any case, the embrittlement agent may be heated up to a temperature that is significantly less than the melting temperature of the solder.

At operation 206, the embrittlement agent is held at the reflow temperature until the embrittlement agent has diffused into the lead and caused liquid metal embrittlement. The amount of time that the embrittlement agent is allowed to diffuse may depend on one or more of the composition of the embrittlement agent, the composition of the lead (and/or solder), the temperature, or the size of the lead/solder joint to be broken. Other factors may also be considered. A processor may determine the amount of time (and/or the temperature) based on these factors.

At operation 208, the electronic component may be removed from the PWB and the method 200 may end. The electronic component may be removed once all of the connecting leads have become brittle due to the embrittlement agent. The electronic component may be removed through the application of a mechanical force (e.g., using a vacuum removal tool or other mechanical tool).

In some embodiments, after the component is removed, the rework operation is completed using operations including site redress using a vacuum solder tool to remove residual alloyed solder from pads, followed by deposition of fresh solder paste of an alloy composition intended for attachment, the placement of new devices, and subsequent device attachment using standard manual or semiautomated reflow soldering equipment Referring now to FIGS. 3A-3E, illustrated is the removal rework process for a surface-mount technology (SMT) electronic component with gull-wing leads, in accordance with embodiments of the present disclosure. It is to be understood that while the sequence illustrating the component removal rework process flow shown in FIGS. 3A-3E is for a SMT component having Gull-Wing Leads, the process can be used for multiple SMT lead geometries, paste-in-hole (PIH) components, leadless components, and some types of BGA components as well. The present disclosure is not to be limited to the specific examples, which are shown for illustrative purposes.

Figure 3A:
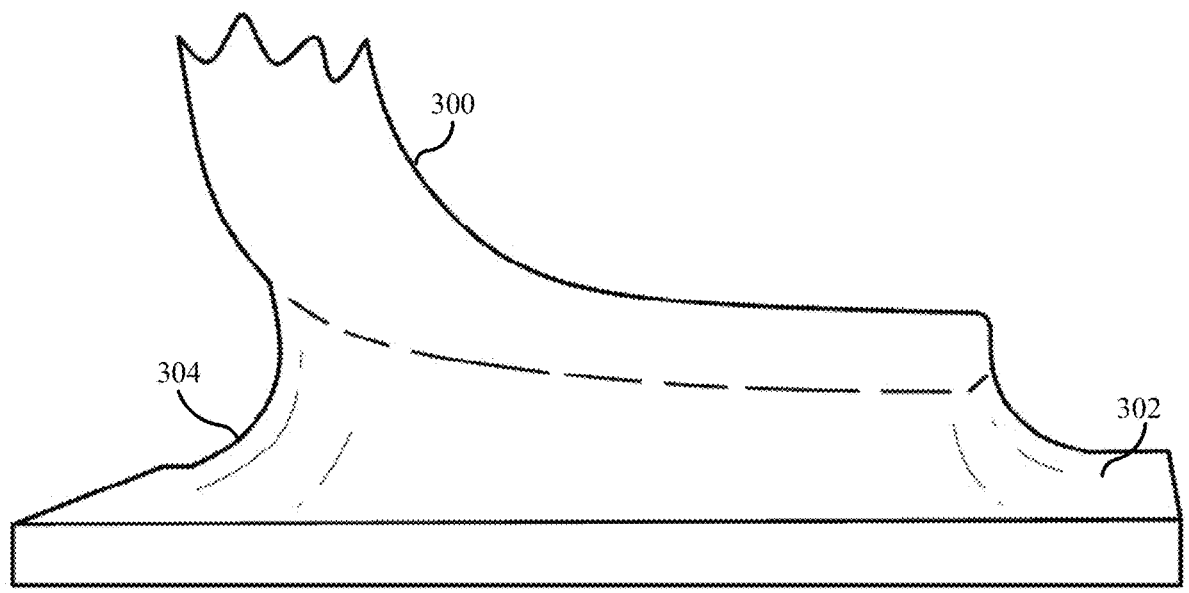
FIGS. 3A-3E illustrate the removal rework process for a surface-mount technology (SMT) electronic component with gull-wing leads, in accordance with embodiments of the present disclosure.
Figure 3B:
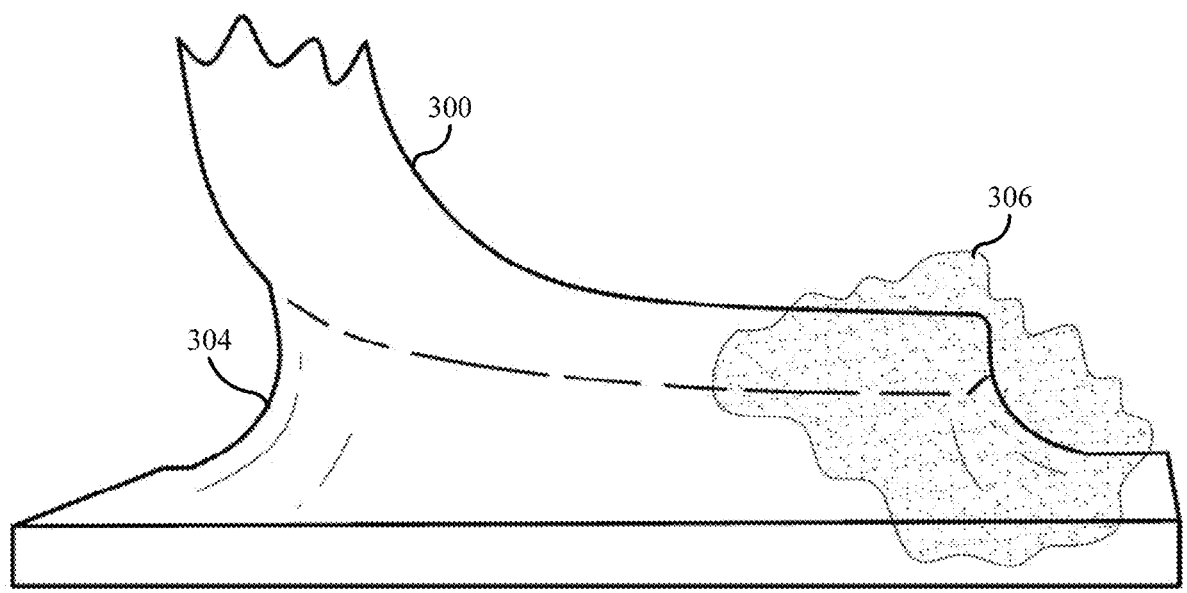

FIG. 3A illustrates a gull-wing component lead 300, which may be removed using an embrittlement paste or emulsion. The component lead 300 is attached to a contact pad 302 via a solder joint 304. As shown in FIG. 3B, a low-melt embrittlement paste 306 is dispense onto the component lead 300 and solder joint 304. As used herein, the embrittlement paste 306 is considered "low-melt" when the reflow/melting temperature of the paste 306 is below the melting point of the solder material.

Figure 3C:
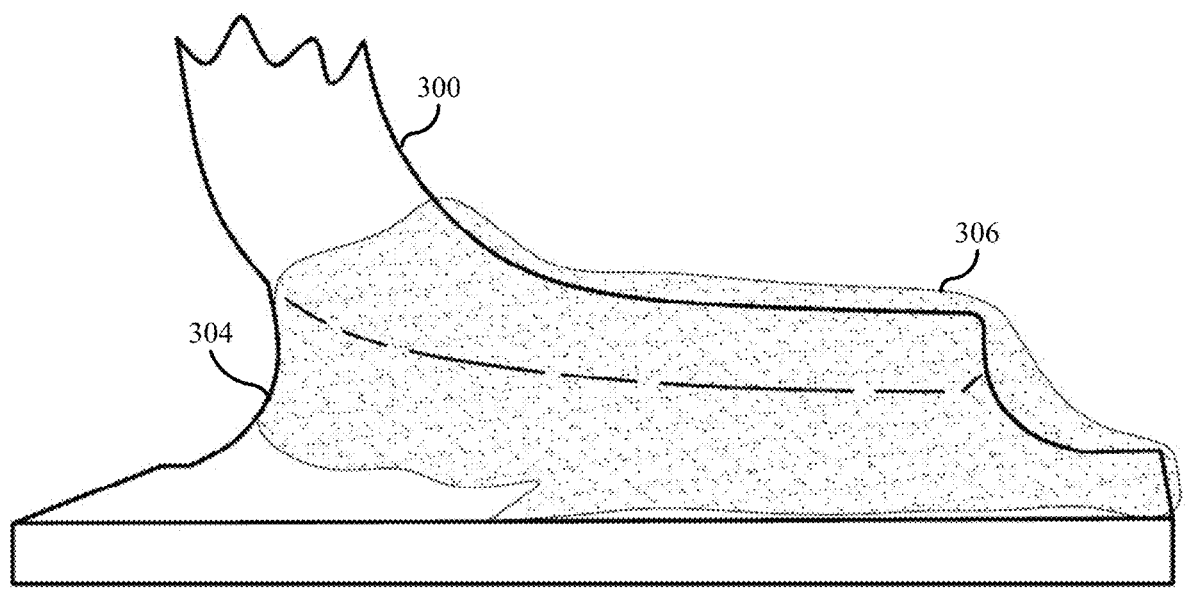
Figure 3D:
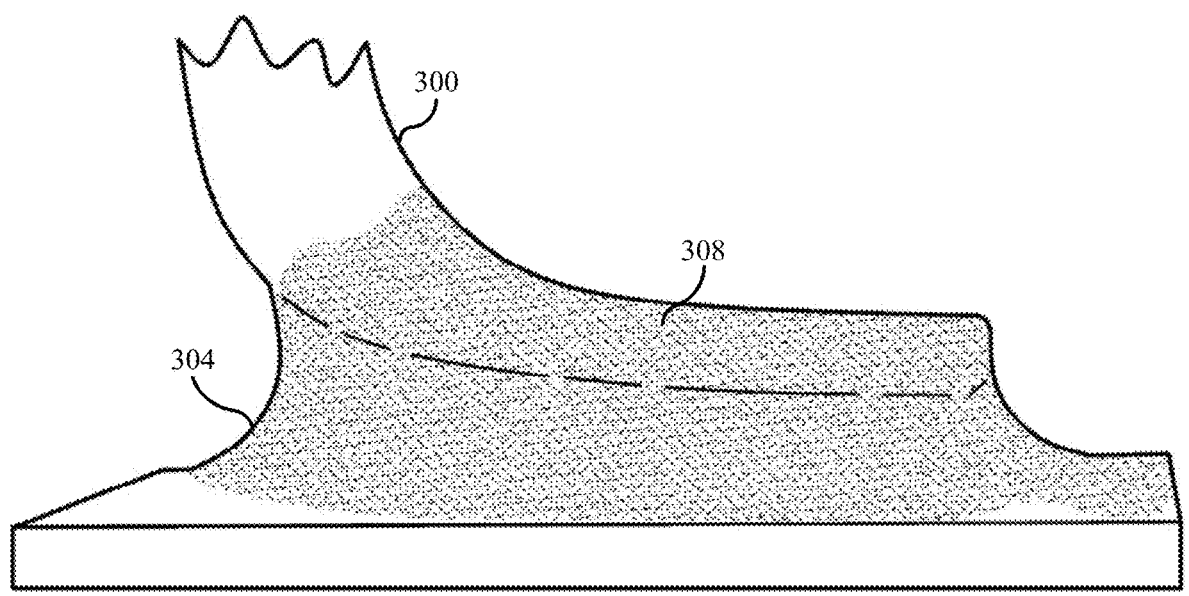
Figure 3E:
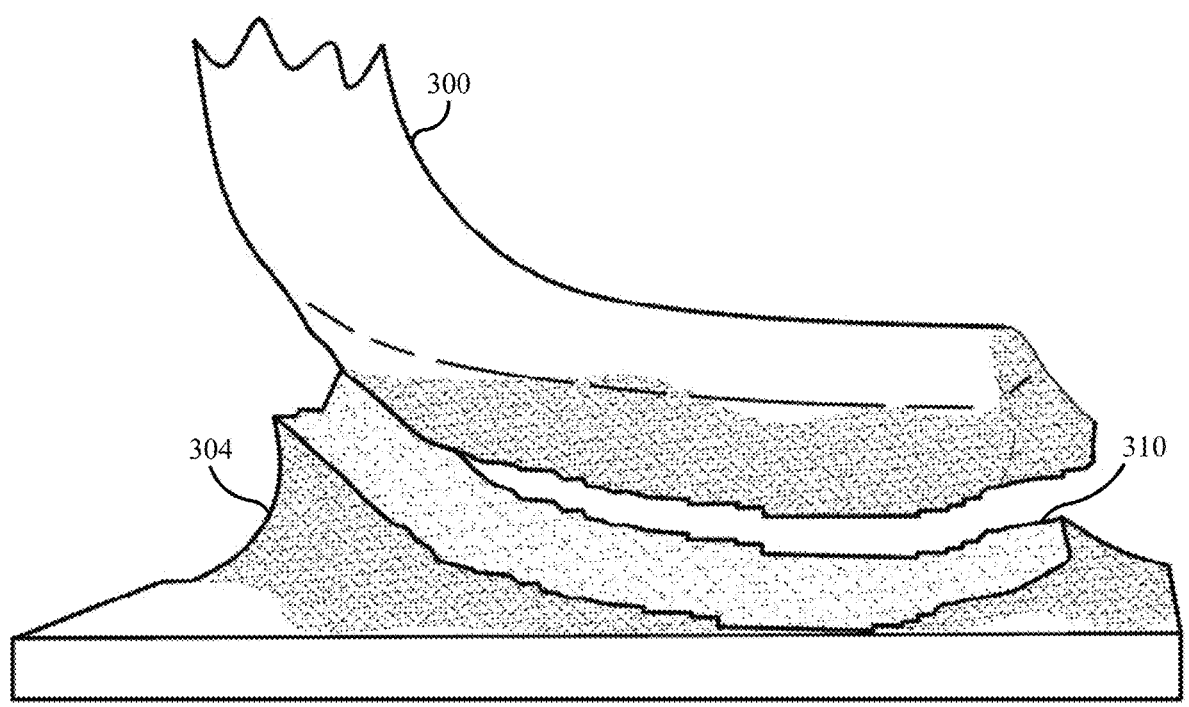

FIG. 3C illustrates the component lead 300 after the assembly is heated to the reflow temperature of the paste 306. As shown in FIG. 3C, the heated paste 306 begins to flow around and wet the component lead 300 and solder joint 304. The assembly is then kept at the reflow temperature to allow the embrittlement paste 306 to diffuse into the component lead 300 and solder joint 304. Specifically, the assembly is held at the reflow temperature to drive liquid infiltration of the melted alloys in the embrittlement paste into grain boundaries of the solder joint 304 and component lead 300. This results in a brittle connection between the component and the PWB, as illustrated in FIG. 3D, due to an interconnected web of liquid that forms throughout an area 308 of the component lead 300 and solder joint 304. After the brittle section 308 has formed, the component can be lifted from the PWB while the joints are in a slushy state, causing the component lead 300 and solder joint 304 to fracture at a point 310 in the brittle area, as shown in FIG. 3E.

Figure 4:
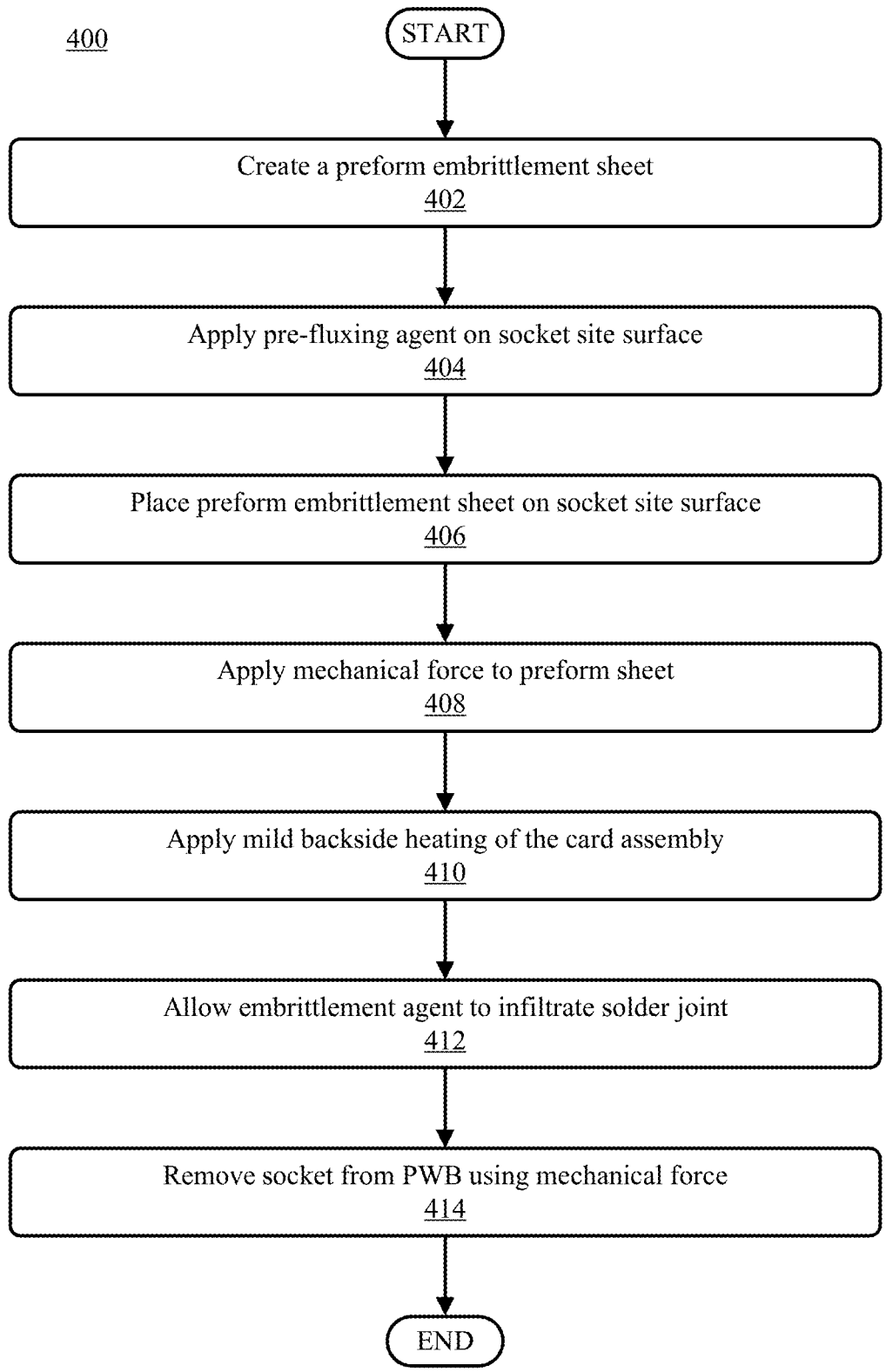
FIG. 4 illustrates a flowchart of an example method for removing a surface-mount electronic component from a PWB using liquid metal infiltration, in accordance with embodiments of the present disclosure.

Referring now to FIG. 4, illustrated is a flowchart of an example method for removing a surface-mount electronic component from a PWB using liquid metal infiltration, in accordance with embodiments of the present disclosure. In some embodiments, the method 400 may be part of an automated (or semi-automated) rework process. For example, one or more operations of the method 400 may be performed by hardware, firmware, software executing on a processor, or any combination thereof. The method 400 may begin at operation 402, wherein an embrittlement sheet is created.

The preform embrittlement sheet is a sheet that contains Ga, Ga—In, Ga—Sn, and/or Ga—In—SN. The embrittlement sheet may be made using any suitable technology for creating thin sheets of metal. For example, the embrittlement sheet may be made using casting, stamping, or rolling methods. The thickness of the embrittlement sheets may depend on the metal or alloy selected. In some embodiments, when alloy sheets are processed, the sheet forming operation may need to be performed under refrigeration with post forming refrigeration required as well since many alloys made from these elements are liquid at room temperature or below. The sheet may be made with a specific thickness, width, and length such that it fits within the socket site that it is being applied to and ensures that all pins are covered by the embrittlement sheet. The sides of the socket housing (e.g., the alignment ring around the perimeter of the housing) can help contain the melted embrittlement sheet such that the embrittlement agent does not leak onto other components.

After forming the embrittlement sheet at operation 402, a pre-fluxing agent may be applied on the socket site surface at operation 404. As discussed herein, the pre-fluxing agent may be applied depending on the selected metal or alloy in the embrittlement sheet. The pre-fluxing agent may be applied due to its anti-oxidation properties, as well as to assist in wetting the contact surfaces with the melted embrittlement sheet.

At operation 406, the embrittlement sheet is placed on the socket site surface, and a mechanical force is applied to the embrittlement sheet at operation 408. The mechanical force may be applied with Teflon to ensure good contact between the embrittlement sheet and the pins in the socket. Furthermore, the force may help break through oxides that have formed on the contacts. In some embodiments, a force of between 50 lbs. and 100 lbs. may be applied.

At operation 410, the PWB assembly may be heated, as necessary to cause the embrittlement sheet to melt and reflow. In some embodiments, only the backside of the board (i.e., the side opposite the embrittlement sheet) is heated. In other embodiments, both sides of the PWB are heated. In these embodiments, the backside of the PWB may be heated to a higher temperature than the frontside of the board (i.e., the side that the embrittlement sheet is on). This creates a temperature bias that help with localized melting of the embrittlement sheet, and also causes the melted embrittlement sheet (e.g., the embrittlement agent) to flow through the socket and onto the contacts.

At operation 412, the embrittlement agent (e.g., melted embrittlement sheet) is allowed to infiltrate the solder joints of the socket. The amount of time that the embrittlement agent is allowed to wet and infiltrate the joints may be based on the material of the embrittlement agent, the material of the solder, the area of contact, etc. After the embrittlement agent has sufficiently infiltrated the solder joints (e.g., when the ductility of the joints are sufficiently reduced to safely remove the component), the socket is removed from the PWB using a mechanical force at operation 414 and the method 400 ends.

Figure 5:
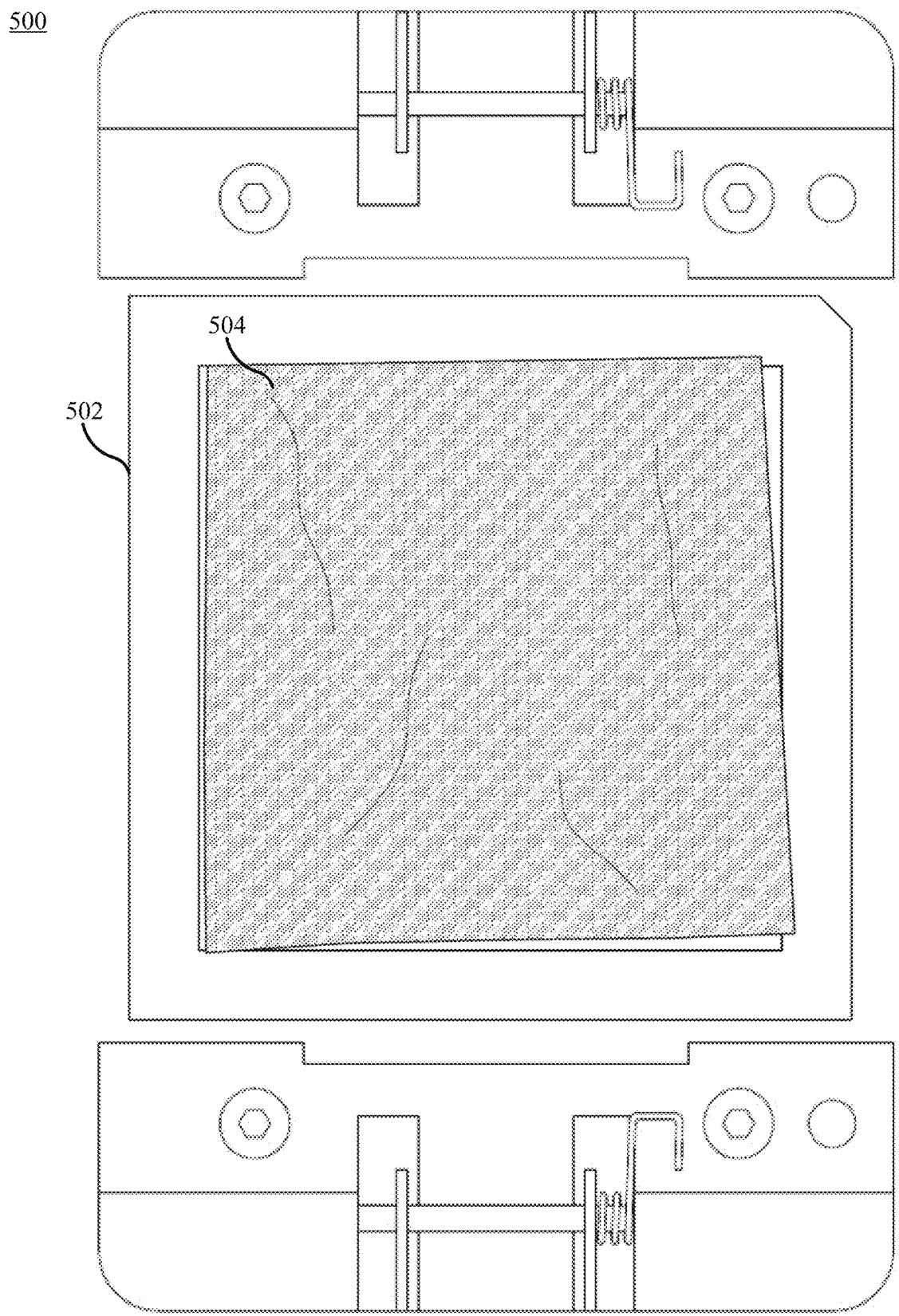
FIG. 5 illustrates an example hybrid land grid array (HLGA) socket with a preformed embrittlement sheet, in accordance with embodiments of the present disclosure.

In some embodiments, after the component is removed, the rework operation is completed using operations including site redress using a vacuum solder tool to remove residual alloyed solder from pads, followed by deposition of fresh solder paste of an alloy composition intended for attachment, the placement of new devices, and subsequent device attachment using standard manual or semiautomated reflow soldering equipment Referring now to FIG. 5, illustrated is a diagram of an example hybrid land grid array (HLGA) socket 500 with a preformed embrittlement sheet 504, in accordance with embodiments of the present disclosure. As can be seen in FIG. 5, the embrittlement sheet 504 is placed within the HLGA socket 500 such that all of the contact pins in the socket 500 are covered by the embrittlement sheet 504. The housing 502 that surrounds the pins is used to keep the embrittlement sheet 504 over the pins, and to contain the liquid embrittlement agents after the embrittlement sheet is melted.

Figure 6B:
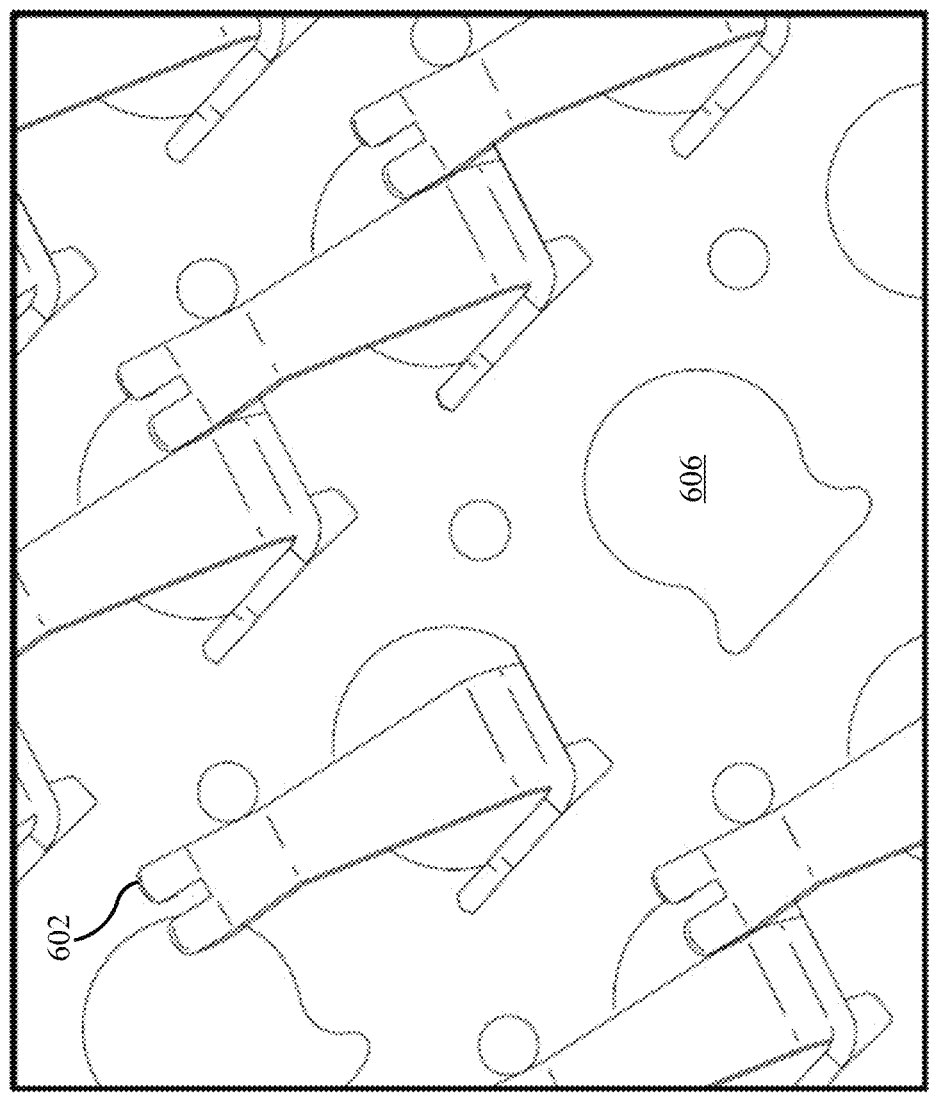
FIG. 6B illustrates a top view of a portion of a HLGA socket housing, in accordance with embodiments of the present disclosure.
Figure 6A:
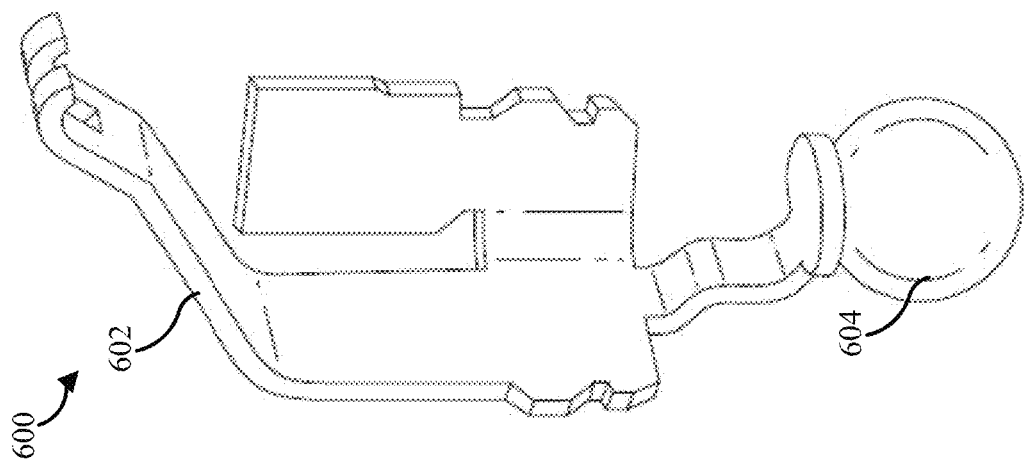
FIG. 6A illustrates an example HLGA connector contact, in accordance with embodiments of the present disclosure.

Referring now to FIG. 6A, illustrated is an example HLGA connector contact 600, in accordance with embodiments of the present disclosure. The HLGA connector contact 600 is embedded in an HLGA socket, and includes a contact pin portion 602 that is configured to connect to a device that is inserted into the socket, and a solder ball 604 that is configured to be soldered to a contact pad of a PWB.

Referring now to FIG. 6B, illustrated is a top view of a portion of a HLGA socket housing, in accordance with embodiments of the present disclosure. As shown in FIG. 6B, the HLGA housing includes a plurality of HLGA connector contacts, with the contact pin portions 602 exposed, and the rest of the connector contact being hidden within the socket. Additionally, the retention holes 606 that the connector contacts are retained within are shown.

Referring now to FIGS. 7A-7D, illustrated is the removal rework process for an HLGA electronic component using a preformed embrittlement sheet, in accordance with embodiments of the present disclosure. It is to be understood that while the sequence illustrating the component removal rework process flow shown in FIGS. 7A-7D is for a HLGA socket, the process can be used for any SMT socket with contacts through a housing material that gives access to the solder joints, include BGA components as well. Accordingly, the present disclosure is not to be limited to the specific examples, which are shown for illustrative purposes.

Figure 7A:
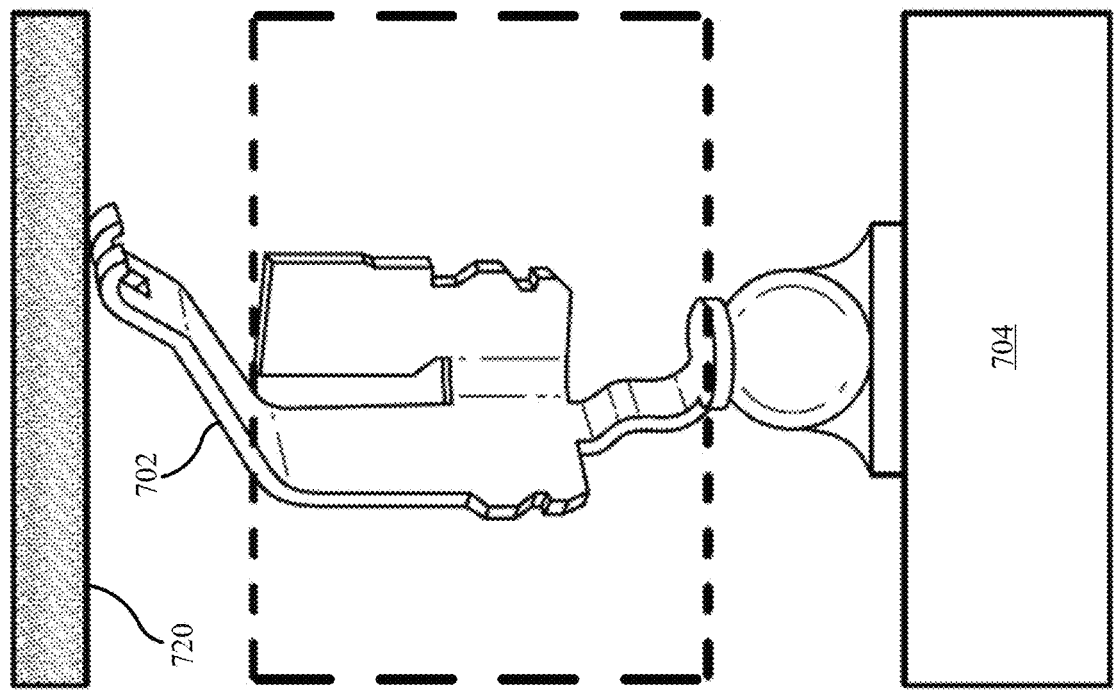
FIGS. 7A-7D illustrate the removal rework process for an HLGA electronic component using a preformed embrittlement sheet, in accordance with embodiments of the present disclosure.

FIG. 7A illustrates a cross section of single HLGA contact 702 in a socket housing 712 (represented by the dashed line). The HLGA contact 702 is connected to a pad 706 on a PWB 704. The HLGA contact 702 has a solder ball 708, which is soldered to the pad 706 at solder joint 710. While the socket housing 712 is shown as including a single HLGA contact 702, this is for illustrative purposes only. In practice, the housing 712 would include a plurality of HLGA contacts 702, each being soldered to its own contact pad 706 on the PWB 704. Furthermore, the walls of the socket housing 712 (not shown) would extend above the top of the HLGA contacts 702.

Figure 7B:
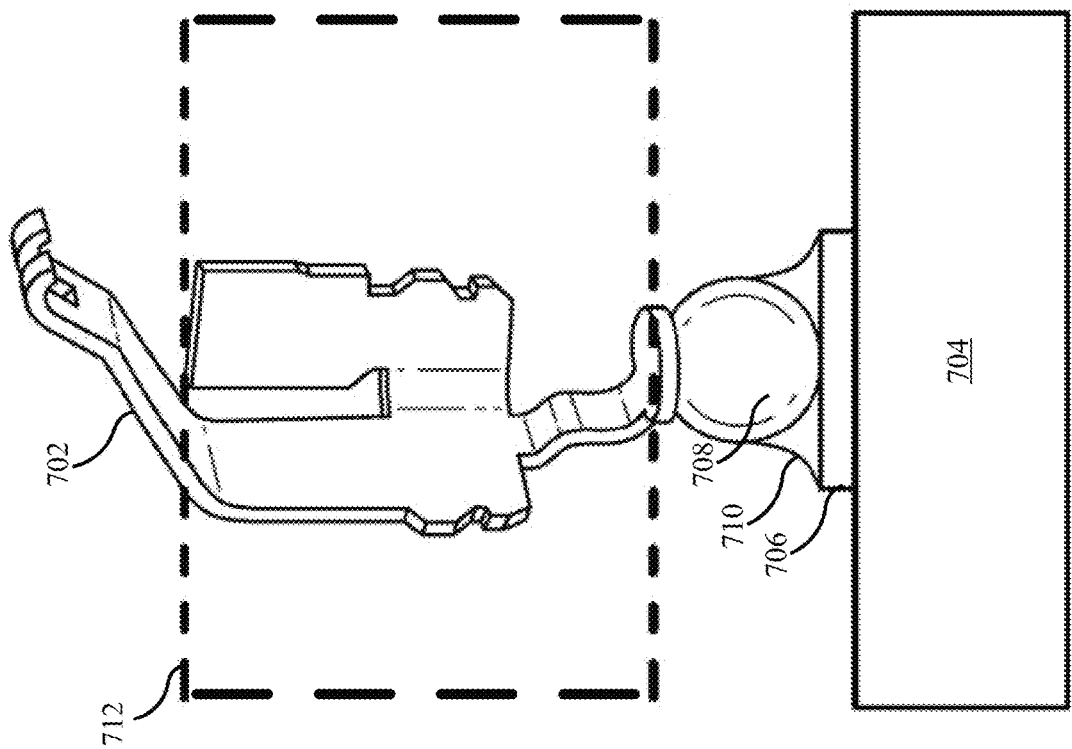

FIG. 7B illustrates an embrittlement sheet 720 applied to a top of the socket housing 712 and HLGA contact 702. A mechanical force (not shown) may be applied to a top of the embrittlement sheet 720 to increase the contact force between the embrittlement sheet 720 and the HLGA contact 702.

Figure 7C:
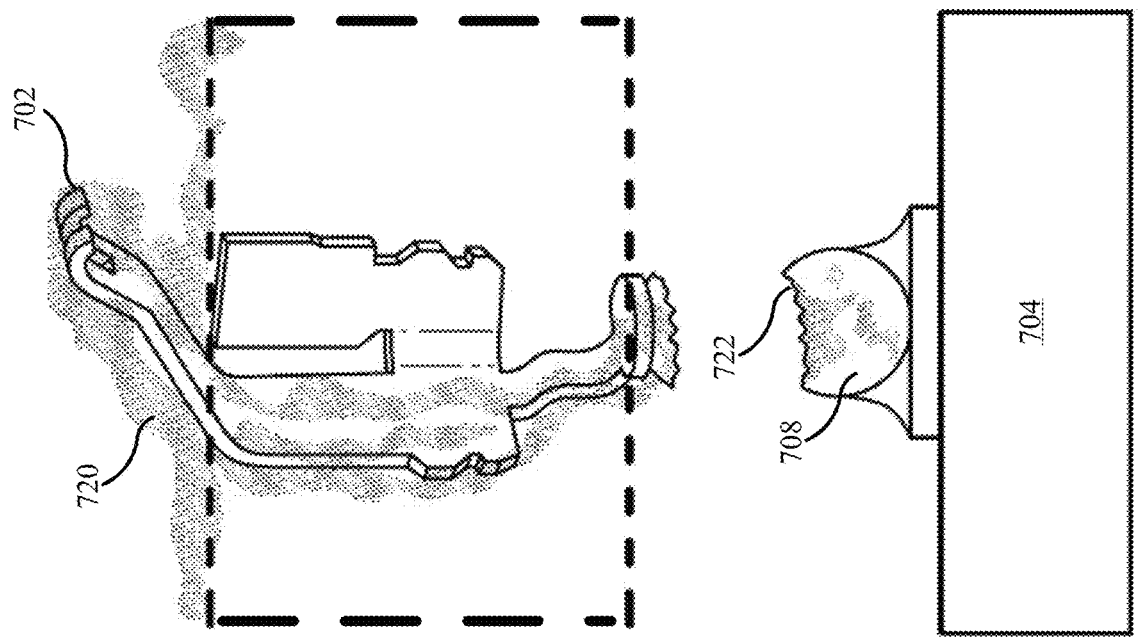

FIG. 7C illustrates the HLGA contact 702 and embrittlement sheet 720 after the embrittlement sheet 720 has melted and wetted the HLGA contact 702. As discussed herein, the embrittlement sheet 720 may be melted by heating the backside (and optionally the frontside) of the PWB 704. As the embrittlement sheet 720 melts, it goes through the retention holes in the housing 712 and wets the HLGA contact 702 through to the solder ball 708.

Figure 7D:
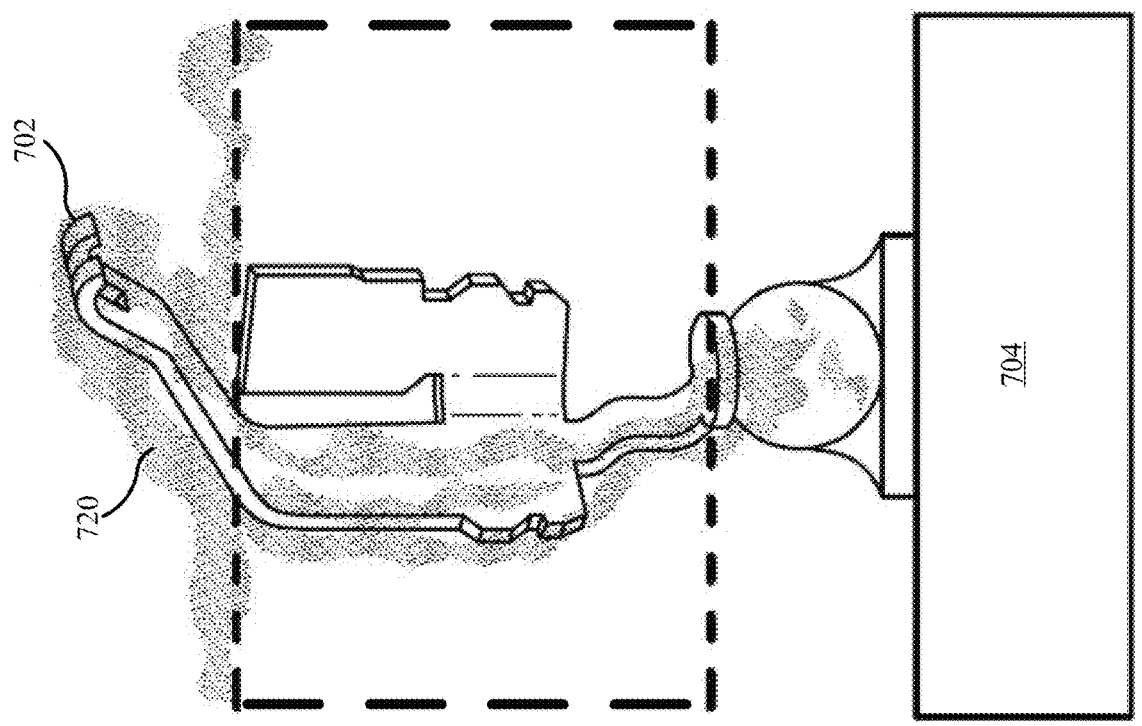

After allowing the melted embrittlement sheet 720 to wet the HLGA contact 702 and solder ball 708 for an amount of time necessary to cause liquid metal embrittlement of the solder ball 708, the HLGA socket may be removed from the PWB 704, as shown in FIG. 7D. The HLGA socket may be removed using a mechanical force that causes a fracture 722 in the solder ball 708.

Figure 8:
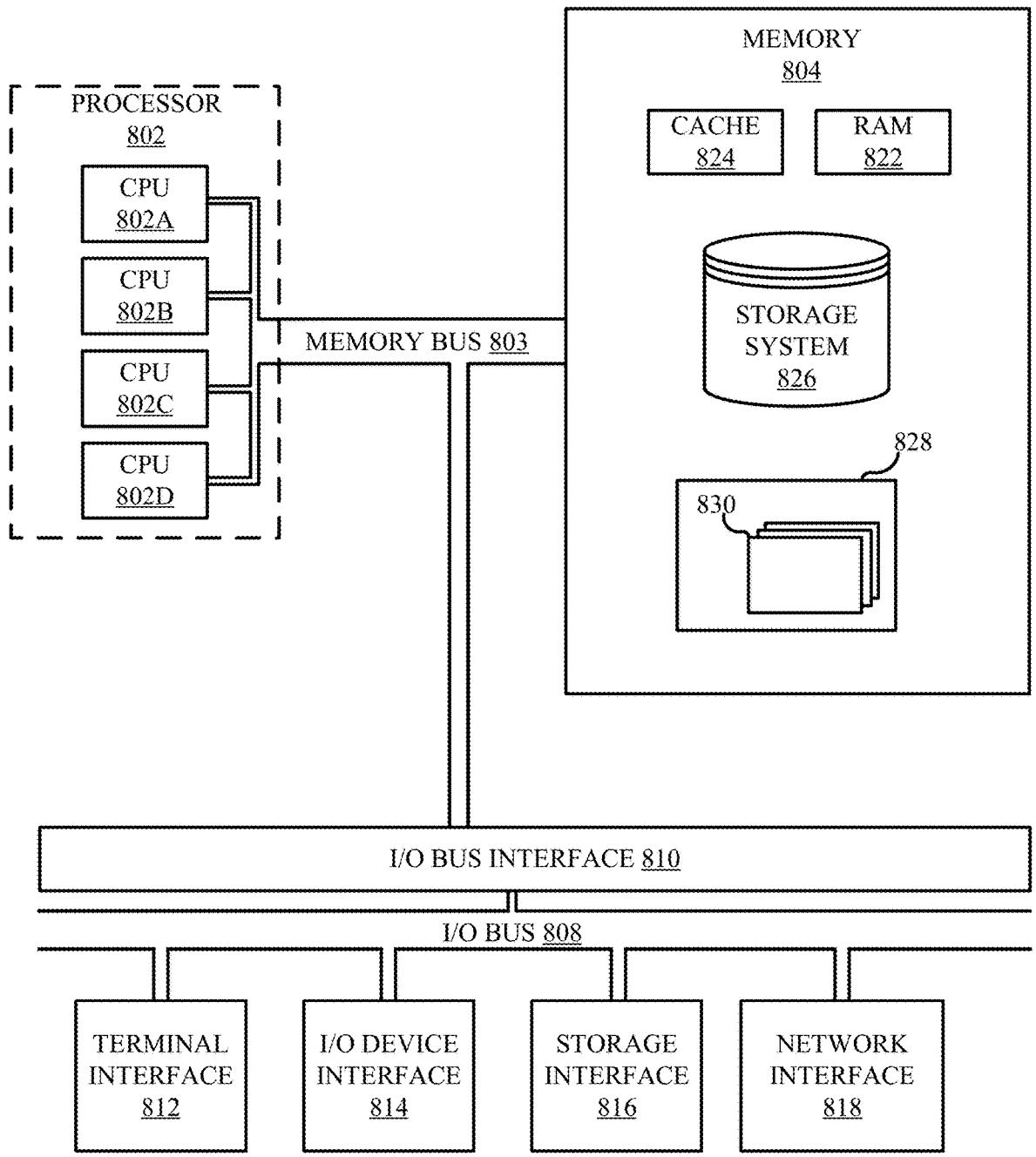
FIG. 8 illustrates a high-level block diagram of an example computer system that may be used in implementing one or more of the methods, tools, and modules, and any related functions, described herein, in accordance with embodiments of the present disclosure.

Referring now to FIG. 8, shown is a high-level block diagram of an example computer system 801 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 801 may comprise one or more CPUs 802, a memory subsystem 804, a terminal interface 812, a storage interface 816, an I/O (Input/Output) device interface 814, and a network interface 818, all of which may be communicatively coupled, directly or indirectly, for inter-component communication via a memory bus 803, an I/O bus 808, and an I/O bus interface unit 810.

The computer system 801 may contain one or more general-purpose programmable central processing units (CPUs) 802A, 802B, 802C, and 802D, herein generically referred to as the CPU 802. In some embodiments, the computer system 801 may contain multiple processors typical of a relatively large system; however, in other embodiments the computer system 801 may alternatively be a single CPU system. Each CPU 802 may execute instructions stored in the memory subsystem 804 and may include one or more levels of on-board cache.

System memory 804 may include computer system readable media in the form of volatile memory, such as random access memory (RAM) 822 or cache memory 824. Computer system 801 may further include other removable/non-removable, volatile/non-volatile computer system storage media. By way of example only, storage system 826 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 804 can include flash memory, e.g., a flash memory stick drive or a flash drive. Memory devices can be connected to memory bus 803 by one or more data media interfaces. The memory 804 may include at least one program product having a set (e.g., at least one) of program modules that are configured to carry out the functions of various embodiments.

One or more programs/utilities 828, each having at least one set of program modules 830 may be stored in memory 804. The programs/utilities 828 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Program modules 830 generally perform the functions or methodologies of various embodiments.

Although the memory bus 803 is shown in FIG. 8 as a single bus structure providing a direct communication path among the CPUs 802, the memory subsystem 804, and the I/O bus interface 810, the memory bus 803 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 810 and the I/O bus 808 are shown as single respective units, the computer system 801 may, in some embodiments, contain multiple I/O bus interface units 810, multiple I/O buses 808, or both. Further, while multiple I/O interface units are shown, which separate the I/O bus 808 from various communications paths running to the various I/O devices, in other embodiments some or all of the I/O devices may be connected directly to one or more system I/O buses.

In some embodiments, the computer system 801 may be a multi-user mainframe computer system, a single-user system, or a server computer or similar device that has little or no direct user interface, but receives requests from other computer systems (clients). Further, in some embodiments, the computer system 801 may be implemented as a desktop computer, portable computer, laptop or notebook computer, tablet computer, pocket computer, telephone, smart phone, network switches or routers, or any other appropriate type of electronic device.

It is noted that FIG. 8 is intended to depict the representative major components of an exemplary computer system 801. In some embodiments, however, individual components may have greater or lesser complexity than as represented in FIG. 8, components other than or in addition to those shown in FIG. 8 may be present, and the number, type, and configuration of such components may vary. Furthermore, the modules are listed and described illustratively according to an embodiment and are not meant to indicate necessity of a particular module or exclusivity of other potential modules (or functions/purposes as applied to a specific module).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications, alterations, and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s). Additionally, it is intended that the following claim(s) be interpreted as covering all such alterations and modifications as fall within the true spirit and scope of the invention.

What is claimed is:

1. A system comprising:
    a memory; and
    a processor communicatively coupled to the memory, wherein the processor is configured to perform a method comprising:
    applying an embrittlement agent to a soldered joint of an electronic component that is soldered to a printed wiring board; and
    removing the electronic component from the printed wiring board by breaking the embrittled joint.

2. The system of claim 1, wherein the embrittlement agent is a paste comprising metal that causes liquid metal embrittlement when it infiltrates the joint of the electronic component.

3. The system of claim 1, wherein the method further comprises:
    heating the applied embrittlement agent to a temperature that meets or exceeds a reflow temperature of the embrittlement agent; and
    holding the embrittlement agent at the temperature for an amount of time to allow the embrittlement agent to at least partially diffuse into the joint,
    wherein removing the electronic component from the printed wiring board is performed after the embrittlement agent has at least partially diffused into the joint.

4. The system of claim 3, wherein the amount of time and the temperature are based on the composition of the embrittlement agent.

5. The system of claim 1, wherein removing the electronic component from the printed wiring board comprises applying a mechanical force to break the joint of the electronic component.

6. The system of claim 1, the method further comprising:
    removing, after removing the electronic component, residual alloyed solder from the printed wiring board using a vacuum solder tool;
    depositing fresh solder paste on pads on the printed wiring board;
    placing a new electronic component on the printed wiring board in place of the electronic component; and
    attaching the new electronic component using a reflow soldering process.

7. The system of claim 1, wherein the embrittlement agent comprises a flux carrier and metal particles.

8. The system of claim 7, wherein the metal particles include one or more particles selected from the group consisting of elemental copper, a copper alloy, elemental silver, a silver alloy, elemental antimony, and an antimony alloy.

9. The system of claim 7, wherein the metal particles further comprise one or more particles selected from the group consisting of elemental gallium, a gallium-tin alloy, a gallium-indium alloy, and a gallium-tin-indium alloy.

10. The system of claim 1, wherein the embrittlement agent further comprises an alcohol emulsion carrier.

11. The system of claim 1, wherein the embrittlement agent comprises:
- a first set of metal particles that cause liquid metal embrittlement when deposited on a metal component; and
- a second set of metal particles, wherein the second set of metal particles includes one or more metal particles selected from the group consisting of elemental copper, a copper alloy, elemental silver, a silver alloy, elemental antimony, and an antimony alloy.

12. The system of claim 11, wherein the first set of metal particles include one or more metal particles selected from the group consisting of elemental gallium, a gallium-tin alloy, a gallium-indium alloy, and a gallium-tin-indium alloy.

13. The system of claim 1, wherein the embrittlement agent is a preformed sheet.

14. The system of claim 13, wherein applying the embrittlement agent to the soldered joint comprises:
- placing the preformed sheet over the electronic component;
- heating the preformed sheet to a temperature that meets or exceeds a reflow temperature of the embrittlement agent; and
- holding the embrittlement agent at the temperature for an amount of time to allow the embrittlement agent to at least partially diffuse into the soldered joint.

15. A system comprising:
- a memory; and
- a processor communicatively coupled to the memory, wherein the processor is configured to perform a method comprising:
- applying an embrittlement agent to a soldered joint of an electronic component that is soldered to a printed wiring board;
- heating the applied embrittlement agent to a temperature that meets or exceeds a reflow temperature of the embrittlement agent;
- holding the embrittlement agent at the temperature for an amount of time to allow the embrittlement agent to at least partially diffuse into the joint; and
- removing, after the embrittlement agent has at least partially diffused into the joint, the electronic component from the printed wiring board by breaking the embrittled joint,
- wherein the embrittlement agent comprises metal particles, wherein the metal particles include one or more particles selected from the group consisting of elemental copper, a copper alloy, elemental silver, a silver alloy, elemental antimony, and an antimony alloy.

16. The system of claim 15, wherein the embrittlement agent is a paste comprising metal that causes liquid metal embrittlement when it infiltrates the joint of the electronic component.

17. The system of claim 15, wherein the amount of time and the temperature are based on the composition of the embrittlement agent.

18. The system of claim 15, wherein removing the electronic component from the printed wiring board comprises applying a mechanical force to break the joint of the electronic component.

19. The system of claim 15, wherein the method further comprises:
- removing, after removing the electronic component, residual alloyed solder from the printed wiring board using a vacuum solder tool;
- depositing fresh solder paste on pads on the printed wiring board;
- placing a new electronic component on the printed wiring board in place of the electronic component; and
- attaching the new electronic component using a reflow soldering process.

20. The system of claim 15, wherein:
- the embrittlement agent is a preformed sheet; and
- applying the embrittlement agent to the soldered joint comprises placing the preformed sheet over the electronic component.

* * * * *